United States Patent
Urakawa

(10) Patent No.: US 7,846,645 B2
(45) Date of Patent: Dec. 7, 2010

(54) METHOD AND SYSTEM FOR REDUCING LINE EDGE ROUGHNESS DURING PATTERN ETCHING

(75) Inventor: Masafumi Urakawa, Salem, MA (US)

(73) Assignee: Tokyo Electron Limited, Tokyo (JP)

( * ) Notice: Subject to any disclaimer, the term of this patent is extended or adjusted under 35 U.S.C. 154(b) by 453 days.

(21) Appl. No.: 11/956,667

(22) Filed: Dec. 14, 2007

(65) Prior Publication Data

US 2009/0155731 A1 Jun. 18, 2009

(51) Int. Cl.
*G03F 7/26* (2006.01)
(52) U.S. Cl. .................... 430/313; 430/311
(58) Field of Classification Search .............. 430/311, 430/322, 327, 313
See application file for complete search history.

(56) References Cited

U.S. PATENT DOCUMENTS

| 2006/0003268 A1 | 1/2006 | Hong et al. | |
|---|---|---|---|
| 2007/0075038 A1* | 4/2007 | Sadjadi et al. | 216/67 |
| 2008/0045022 A1 | 2/2008 | Kurihara et al. | |

FOREIGN PATENT DOCUMENTS

| EP | 0753885 A | 1/1997 |
|---|---|---|
| JP | 2004172312 A | 6/2004 |
| JP | 2007324384 A | 12/2007 |
| WO | 2006030581 A | 3/2006 |

OTHER PUBLICATIONS

International Searching Authority, International Search Report and Written Opinion, International Application No. PCT/US2008/086137, Mailed Mar. 12, 2009, 19 pages.

* cited by examiner

*Primary Examiner*—Kathleen Duda

(57) ABSTRACT

A method of mitigating pattern defects, such as critical dimension (CD) bias and line-edge roughness (LER), during a pattern transfer process is described. The method comprises forming one or more layers on a substrate, forming a radiation sensitive mask layer on the one or more layers, and forming a pattern in the radiation sensitive mask layer using a lithographic process. Once the pattern is formed, the edges of the pattern are smoothed by exposing the pattern in the radiation sensitive mask layer to a fluorohydrocarbon-containing plasma. Thereafter, the smoothed pattern in the radiation sensitive mask layer is transferred to one or more of the one or more layers using one or more etching processes.

20 Claims, 10 Drawing Sheets

METHOD AND SYSTEM FOR REDUCING LINE EDGE ROUGHNESS DURING PATTERN ETCHING

BACKGROUND OF THE INVENTION

1. Field of Invention

The invention relates to a method for mitigating pattern defects, such as critical dimension (CD) bias and line edge roughness (LER), and more particularly to a method for smoothing the edges of a pattern in order to reduce CD bias and LER.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

SUMMARY OF THE INVENTION

The invention relates to a method for transferring a pattern to a thin film. Additionally, the invention relates to a method for mitigating pattern defects, such as critical dimension (CD) bias and line edge roughness (LER), and more particularly to a method for smoothing the edges of a pattern in order to reduce CD bias and LER.

According to one embodiment, a method of mitigating pattern defects during a pattern transfer process is described. The method comprises forming one or more layers on a substrate, forming a light sensitive mask layer on the one or more layers, and forming a pattern in the light sensitive mask layer using a lithographic process. Once the pattern is formed, edges of the pattern are smoothed by exposing the pattern in the light sensitive mask layer to a fluorohydrocarbon-containing plasma. Thereafter, the smoothed pattern in the light sensitive mask layer is transferred to one or more of the one or more layers using one or more etching processes.

According to another embodiment, a method of performing a pattern transfer process is described, comprising: forming a film stack on a substrate, the film stack comprising a polysilicon layer, a hard mask layer formed on the polysilicon layer, and an anti-reflective coating (ARC) layer formed on the hard mask layer, and a radiation sensitive mask layer formed on the ARC layer; forming a pattern in the radiation sensitive mask layer using a lithographic process; trimming a lateral dimension of the pattern in the radiation sensitive layer; transferring the trimmed pattern to the ARC layer using a first dry plasma etching process; smoothing the edges of the trimmed pattern by exposing the trimmed pattern in the radiation sensitive mask layer to a fluorohydrocarbon-containing plasma; transferring the smoothed pattern in the radiation sensitive mask layer and the ARC layer to the hard mask layer using a second dry plasma etching process; and transferring the smoothed pattern in the hard mask layer to the polysilicon layer using a third dry plasma etching process.

DETAILED DESCRIPTION OF SEVERAL EMBODIMENTS

Figure 1A:
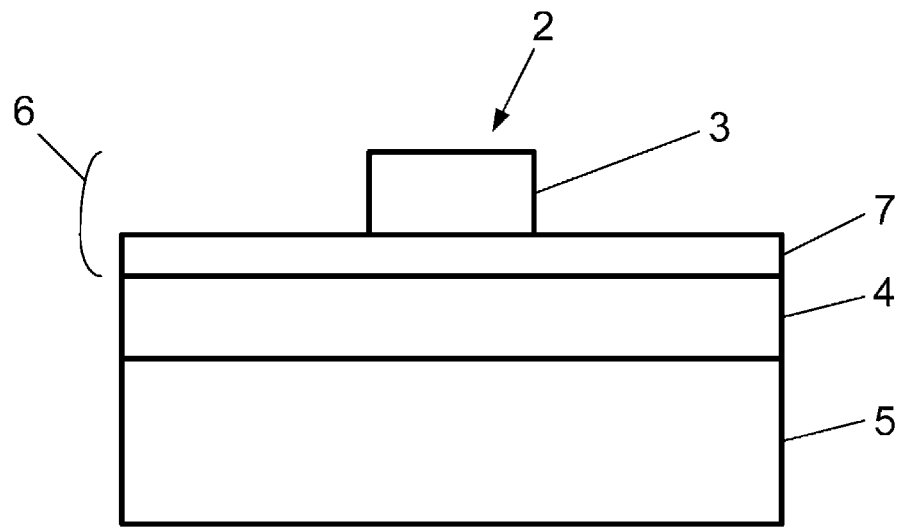
FIGS. 1A through 1C show a schematic representation of a typical procedure for pattern etching a thin film

A method for treating a substrate following an etching process is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

In material processing methodologies, pattern etching comprises the application of a thin layer of radiation sensitive material, such as photoresist, to an upper surface of a substrate, that is subsequently patterned in order to provide a mask for transferring this feature pattern to the underlying thin film during etching. The patterning of the radiation-sensitive material generally involves exposure of the lithographic layer to a geometric pattern of electromagnetic (EM) radiation using, for example, a micro-lithography system, followed by the removal of the irradiated regions of the light-sensitive material (as in the case of positive photoresist), or non-irradiated regions (as in the case of negative photoresist) using a developing solvent.

Additionally, multi-layer masks can be implemented for etching features in a thin film. For example, when etching features in a thin film using a multilayer mask, the mask pattern in the radiation sensitive layer is transferred to the underlying layer(s) of the multilayer mask using a separate etch step preceding the main etch step for the thin film.

During the dry development of underlying layers of the multilayer mask and the transfer of the feature pattern to underlying layers using the multilayer mask, plasma is often utilized to create and assist surface chemistry on a substrate to facilitate the removal of material from the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

Figure 1B:
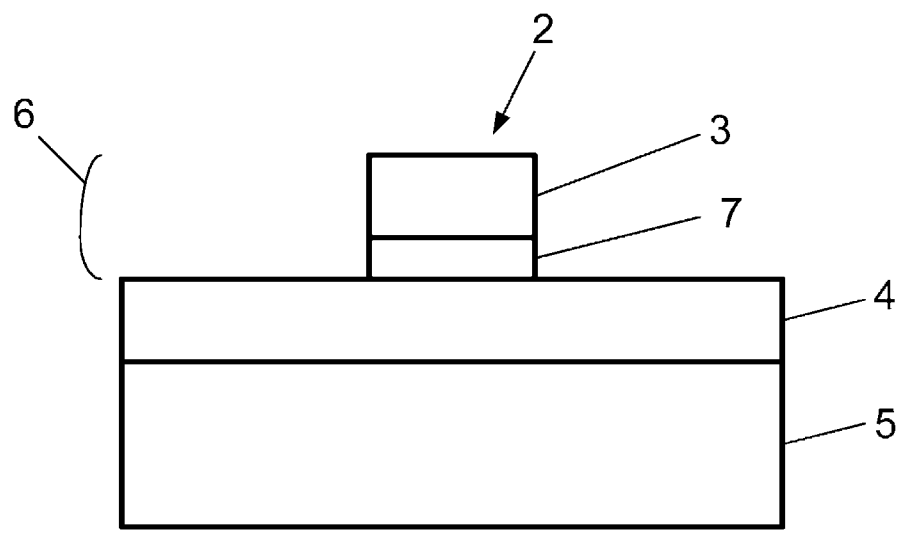
Figure 1C:
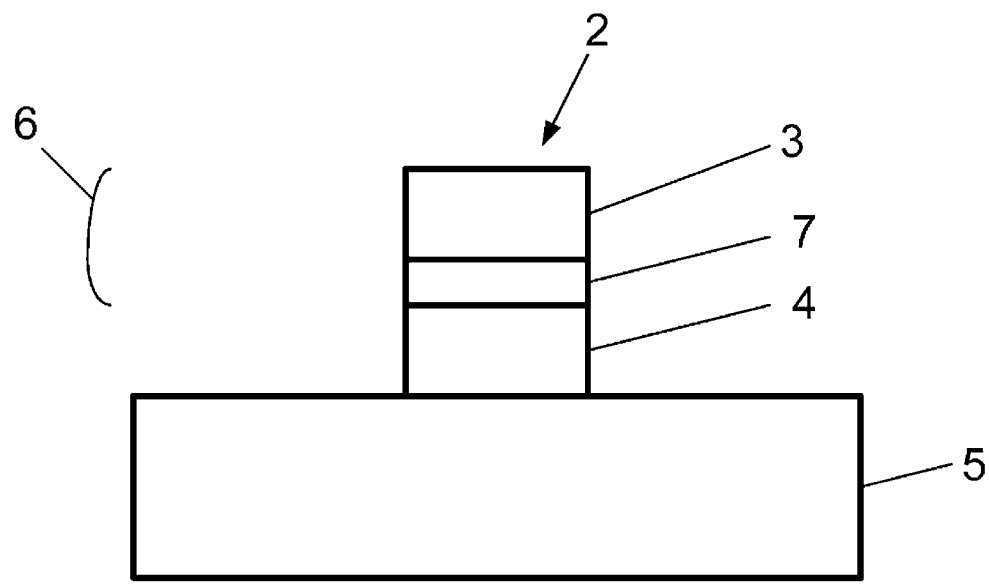

For example, as shown in FIGS. 1A through 1C, a multi-layer mask 6 comprising radiation sensitive layer 3, such as a silicon or non-silicon containing radiation sensitive mask layer, with pattern 2 formed using conventional lithographic techniques and an anti-reflective coating (ARC) layer 7, such as an inorganic or organic ARC, can be utilized as a mask for etching a material such as thin film 4 on substrate 5, wherein the mask pattern 2 in the radiation-sensitive layer 3 is transferred to the ARC layer 7 using a separate etch step preceding the main etch step for the thin film 4. The multilayer mask 6 may comprise additional layers including soft mask layers or hard mask layers or a combination thereof. For example, the multilayer mask 6 may further include an organic planarization layer (OPL).

However, during the various etch steps that are utilized to transfer the pattern in the initial mask layer, such as the layer of radiation-sensitive material, to the underlying thin film 4, pattern defects, including undulations or variations in the edge profile of the pattern as well as variations in pattern dimension, can be propagated in to the underlying thin film 4. Undulations or variations in the pattern edge may be referred to as line edge roughness (LER), while shifts in pattern CD may be referred to as CD bias or CD shift. These pattern defects may arise due to damage to the layer of radiation sensitive material. The radiation-sensitive layer 3 may comprise 248 nm (nanometer) photoresist, 193 nm resist, 157 nm resist, EUV (extreme ultraviolet) resist, or electron-sensitive resist. During the application of the resist, the post-application bake (PAB), the resist exposure step, the post-exposure bake (PEB), or the wet developing step, or any combination thereof, the resist may be damaged. Furthermore, damage may occur during the initial phases of the ARC layer etch or thin film etch.

Figure 1D:
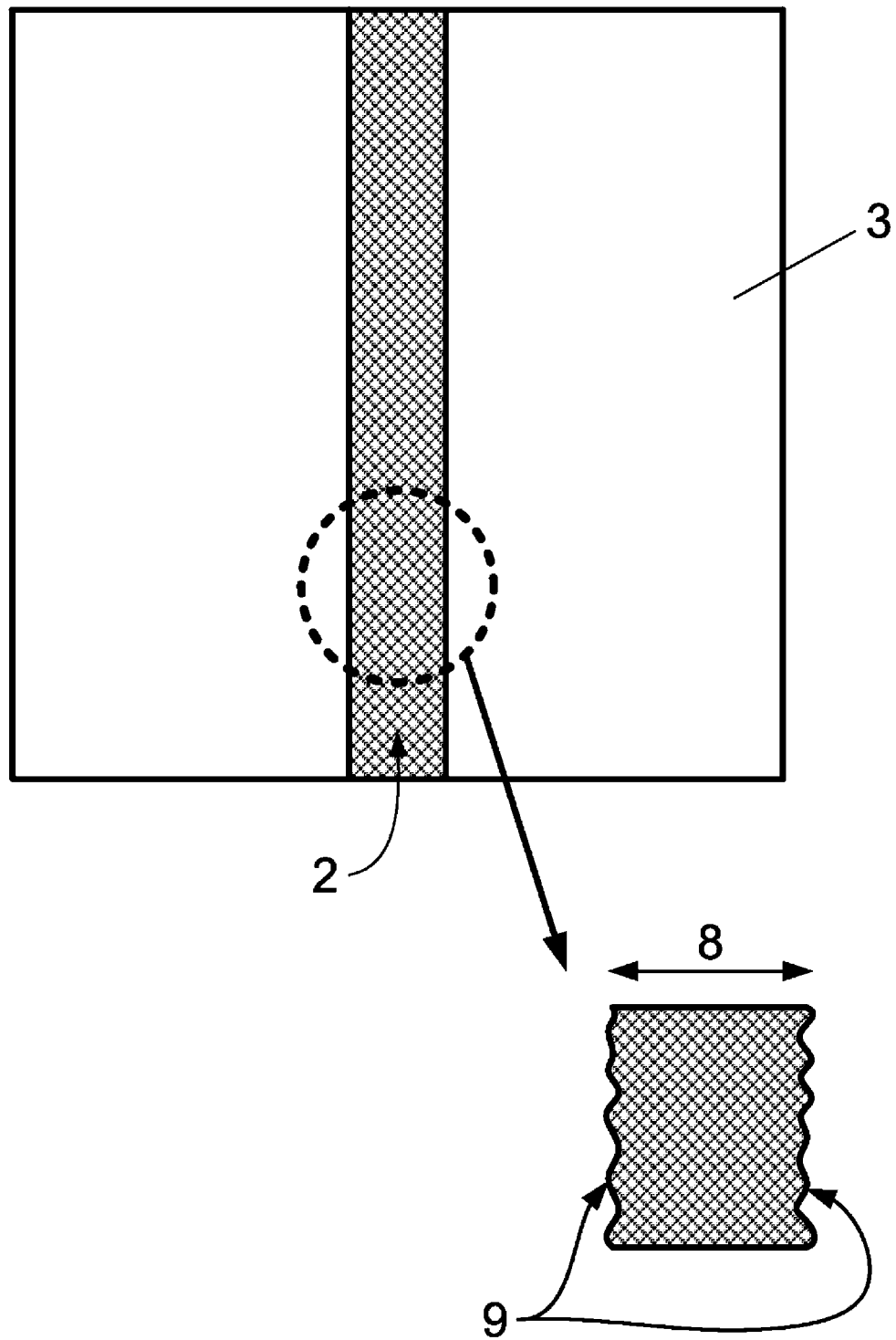
FIG. 1D illustrates line edge roughness (LER) in a pattern formed in a mask layer.

For example, referring to FIG. 1D, a top view of pattern 2 is illustrated in radiation sensitive layer 3. An exploded view of a portion of pattern 2 is also illustrated. Following the formation of the pattern in the radiation sensitive layer 3, pattern edge roughness 9 may occur, and may cause variability in the lateral dimension 8 of pattern 2. This variability in the lateral dimension may then be propagated into the underlying layers.

Figure 2:
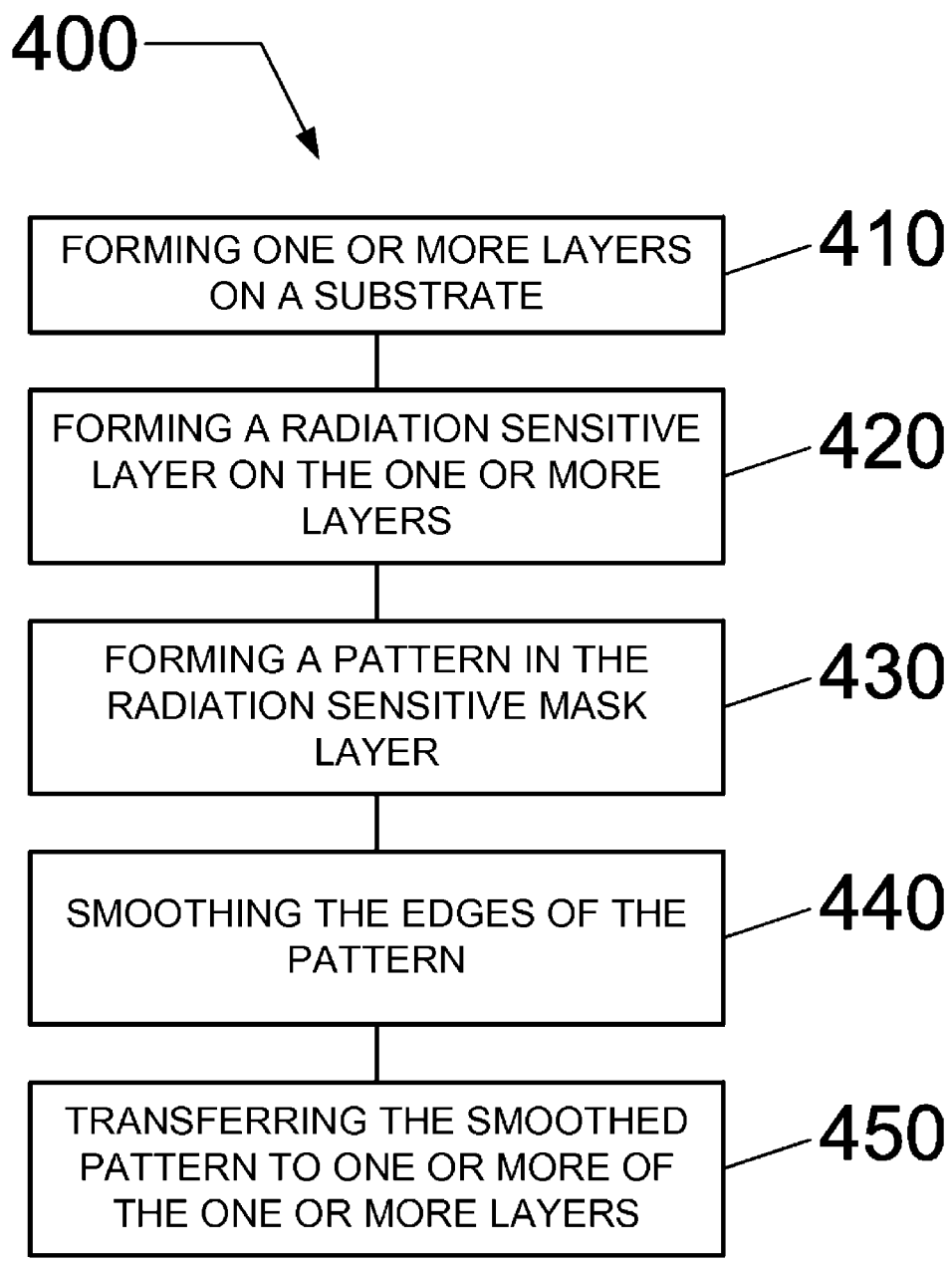
FIG. 2 presents a method of reducing LER during a pattern transfer process according to an embodiment.

According to one embodiment, as shown in FIG. 2, a method of mitigating pattern defects during a pattern transfer process is described. The method includes a procedure 400 beginning in 410 with forming one or more layers on a substrate. In 420, a radiation sensitive mask layer is formed on the one or more layers and, in 430, a pattern is formed in the radiation sensitive mask layer using a lithographic process.

In 440, once the pattern is formed, edges of the pattern are smoothed by exposing the pattern in the radiation sensitive mask layer to a fluorohydrocarbon-containing plasma. Thereafter, in 450, the smoothed pattern in the radiation sensitive mask layer is transferred to one or more of the one or more layers using one or more etching processes.

The fluorohydrocarbon-containing plasma may be formed by introducing a process gas including as an incipient ingredient a fluorohydrocarbon gas to a process chamber and igniting plasma from the process gas. The fluorohydrocarbon gas may be characterized by the chemical formula $C_xF_yH_z$, wherein x, y and z represent integers greater than or equal to unity. For example, the process gas may include as incipient ingredients $CHF_3$, $CH_2F_2$, $C_2HF_5$, $C_2H_2F_2$, or $C_2H_4F_2$, or any combination of two or more thereof. Additionally, the process gas may further include as an incipient ingredient a fluorocarbon gas, or a hydrocarbon gas, or both. Additionally, the process gas may further include as an incipient ingredient an inert gas, such as a noble gas. Furthermore, the process gas may further include as an incipient ingredient $O_2$, $CO$, $CO_2$, $NO$, $NO_2$, $N_2O$, $H_2$, $N_2$ or $NH_3$, or any combination of two or more thereof.

Figure 3:
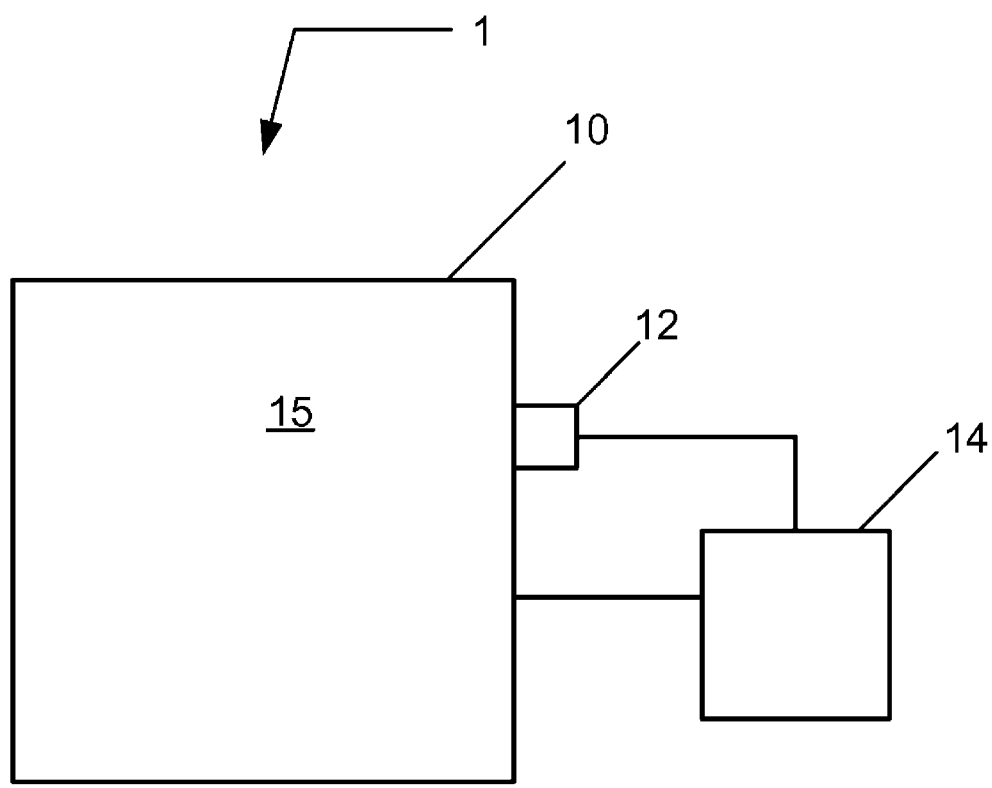
FIG. 3 shows a simplified schematic representation of a plasma processing system according to an embodiment of the present invention.

According to another embodiment, a plasma processing system 1 is depicted in FIG. 3 comprising a plasma processing chamber 10 configured to produce plasma in process space 15, a diagnostic system 12 coupled to the plasma processing chamber 10, and a controller 14 coupled to the diagnostic system 12 and the plasma processing chamber 10. The controller 14 is configured to execute a process recipe to transfer a pattern to a thin film. Additionally, controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 3, utilizes a plasma for material processing. Plasma processing system 1 can comprise an etch chamber.

Figure 4:
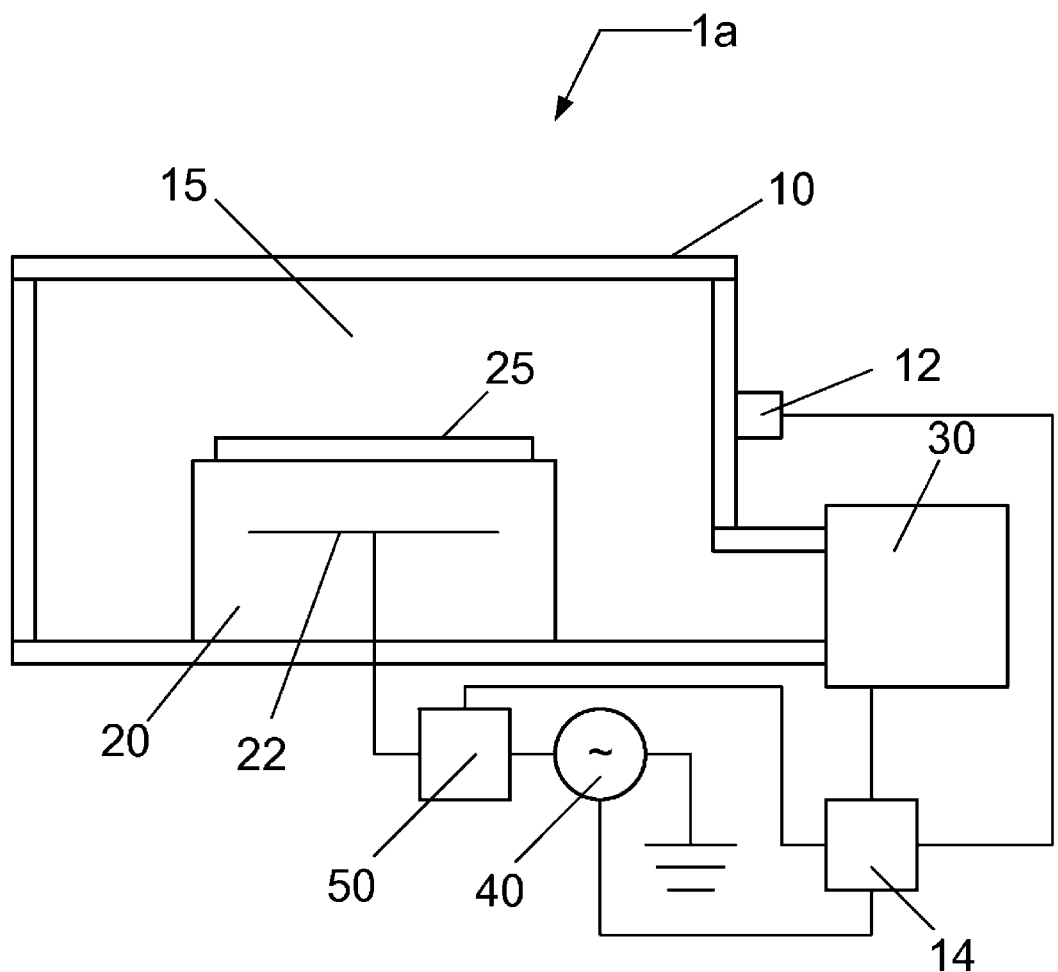
FIG. 4 shows a schematic representation of a plasma processing system according to an embodiment.

According to the embodiment depicted in FIG. 4, plasma processing system 1 a can comprise plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in process space 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1 a can be configured to process a substrate of any size, such as 200 mm substrates, 300 mm substrates, or larger.

Substrate 25 can be affixed to the substrate holder 20 via a mechanical clamping system or an electrical clamping system, such as an electrostatic clamping system. Furthermore, substrate holder 20 can further include a heating/cooling system including a re-circulating fluid flow that receives heat from substrate holder 20 and transfers heat to a heat exchanger system (not shown) when cooling, or receives heat from a heat exchanger and transfers heat to substrate holder 20 when heating.

Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 4, substrate holder 20 can comprise an electrode 22 through which RF power is coupled to the processing plasma in process space 15. For example, electrode 22 can be electrically biased at a RF voltage via the transmission of RF power from a RF generator 40 through an optional impedance match network 50 to electrode 22. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, π-type, T-type, etc.) and automatic control methods are well known to those skilled in the art.

Vacuum pumping system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mtorr. For high pressure processing (i.e., greater than 100 mtorr), a mechanical booster pump and dry roughing pump can be used. Furthermore, a device for monitoring chamber pressure (not shown) can be coupled to the plasma processing chamber 10. The pressure measuring device can be, for example, a capacitance manometer commercially available from MKS Instruments, Inc. (Andover, Mass.).

Controller 14 comprises a microprocessor, memory, and a digital I/O port capable of generating control voltages sufficient to communicate and activate inputs to plasma processing system 1a as well as monitor outputs from plasma processing system 1a. Moreover, controller 14 can be coupled to and can exchange information with RF generator 40, impedance match network 50, the gas injection system (not shown), vacuum pumping system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform a pattern transfer process.

Controller 14 may be locally located relative to the plasma processing system 1a, or it may be remotely located relative to the plasma processing system 1a via an internet or intranet. Thus, controller 14 can exchange data with the plasma processing system 1a using at least one of a direct connection, an intranet, or the internet. Controller 14 may be coupled to an intranet at a customer site (i.e., a device maker, etc.), or coupled to an intranet at a vendor site (i.e., an equipment manufacturer). Furthermore, another computer (i.e., controller, server, etc.) can access controller 14 to exchange data via at least one of a direct connection, an intranet, or the internet.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include a line CCD (charge coupled device), a CID (charge injection device) array, or a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337, the contents of which are incorporated herein by reference.

The diagnostic system 12 can include a high resolution Optical Emission Spectroscopy (OES) sensor such as from Peak Sensor Systems, or Verity Instruments, Inc. Such an OES sensor can have a broad spectrum that spans the ultraviolet (UV), visible (VIS), and near infrared (NIR) light spectrums. The resolution can be approximately 1.4 Angstroms, that is, the sensor can be capable of collecting about 5550 wavelengths from about 240 to about 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light passing through an optical vacuum window can be focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

In the embodiment shown in FIG. 5, the plasma processing system 1b can be similar to the embodiment of FIG. 3 or 4 and further comprise either a stationary, or mechanically or electrically rotating magnetic field system 60, in order to potentially increase plasma density and/or improve plasma processing uniformity, in addition to those components described with reference to FIG. 3 and FIG. 4. Moreover, controller 14 can be coupled to magnetic field system 60 in order to regulate the speed of rotation and field strength. The design and implementation of a rotating magnetic field is well known to those skilled in the art.

Figure 5:
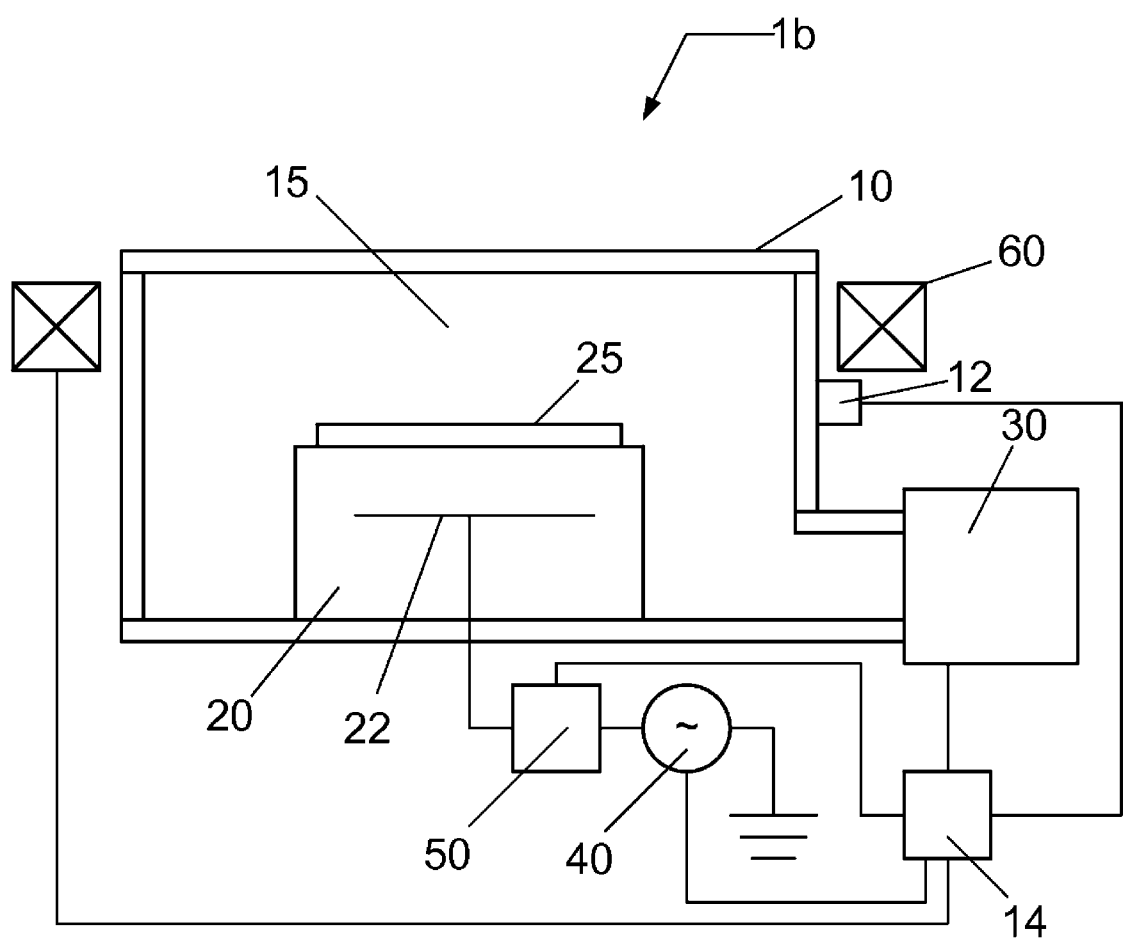
FIG. 5 shows a schematic representation of a plasma processing system according to another embodiment.
Figure 6:
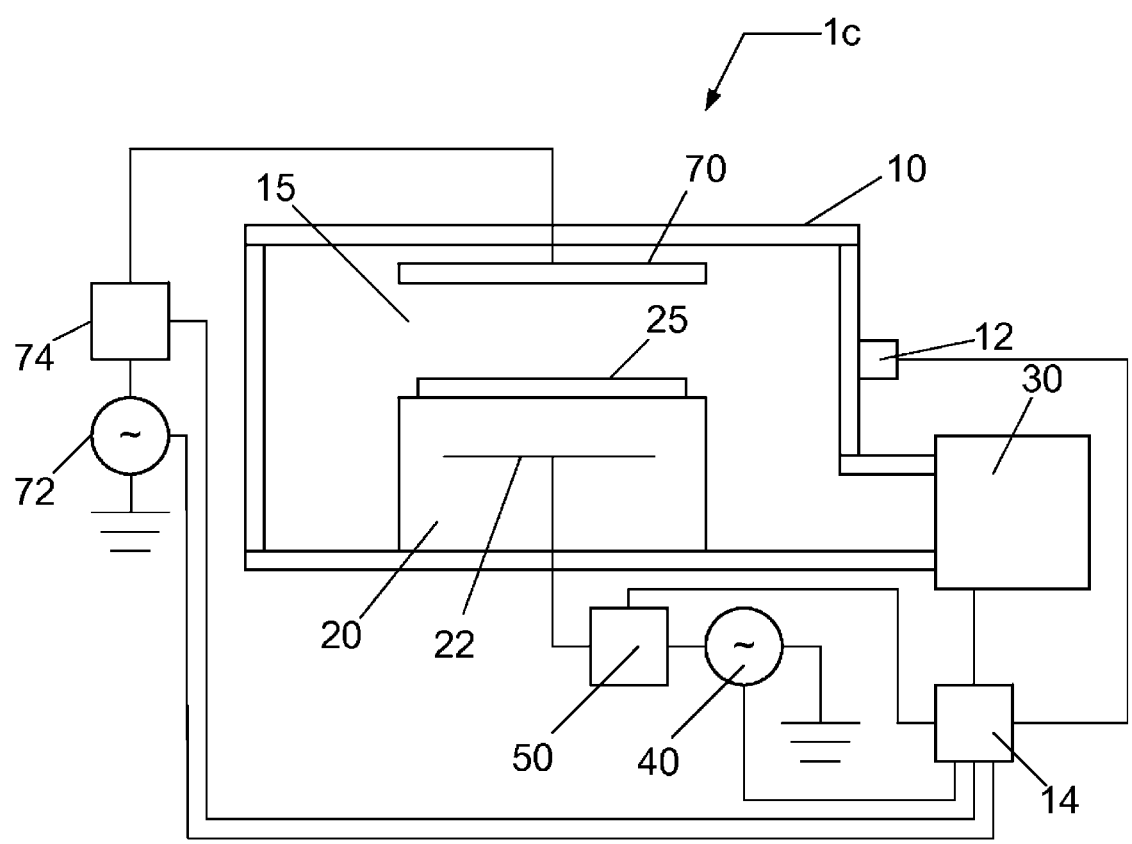
FIG. 6 shows a schematic representation of a plasma processing system according to another embodiment.

In the embodiment shown in FIG. 6, the plasma processing system 1c can be similar to the embodiment of FIG. 3, FIG. 4 or FIG. 5, and can further comprise an upper electrode 70 to which RF power can be coupled from RF generator 72 through an optional impedance match network 74. A typical frequency for the application of RF power to the upper electrode can range from about 0.1 MHz to about 200 MHz. Additionally, a typical frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 7:
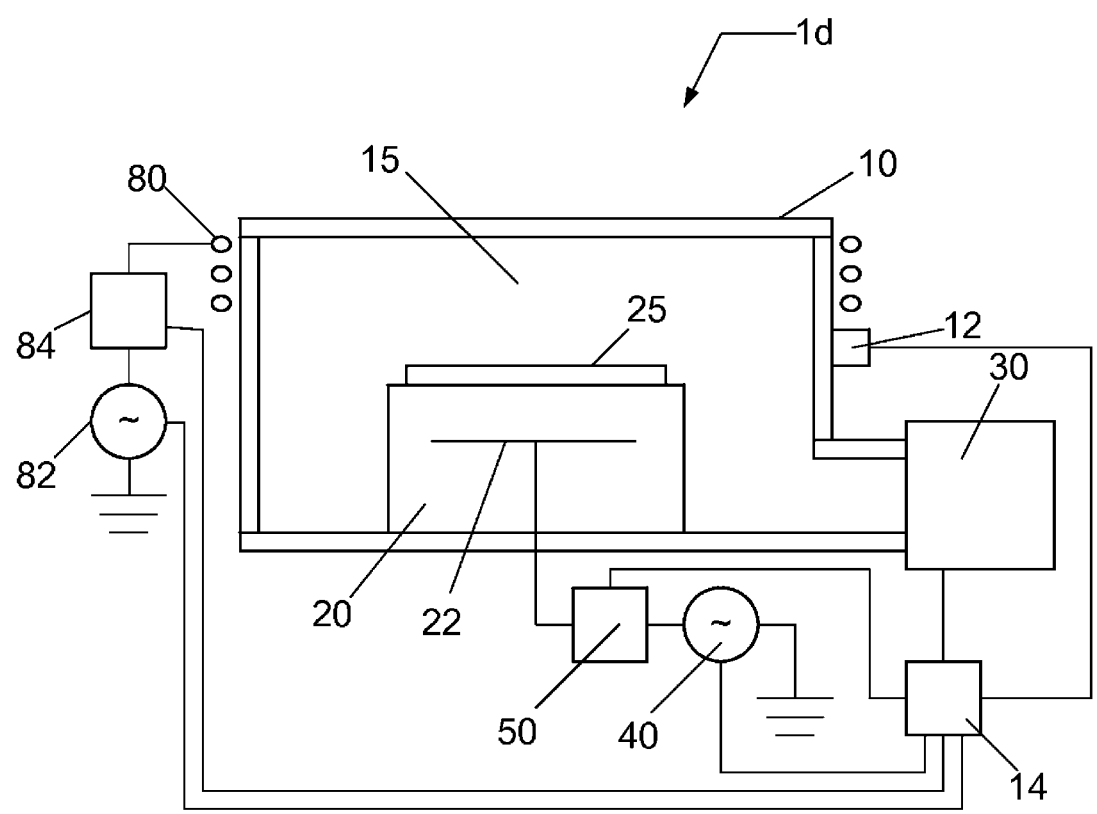
FIG. 7 shows a schematic representation of a plasma processing system according to another embodiment.

In the embodiment shown in FIG. 7, the plasma processing system 1d can, for example, be similar to the embodiments of FIGS. 2, 3, 4, 5 and 6, and can further comprise an inductive coil 80 to which RF power is coupled via RF generator 82 through an optional impedance match network 84. RF power is inductively coupled from inductive coil 80 through a dielectric window (not shown) to process space 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the process space 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 8:
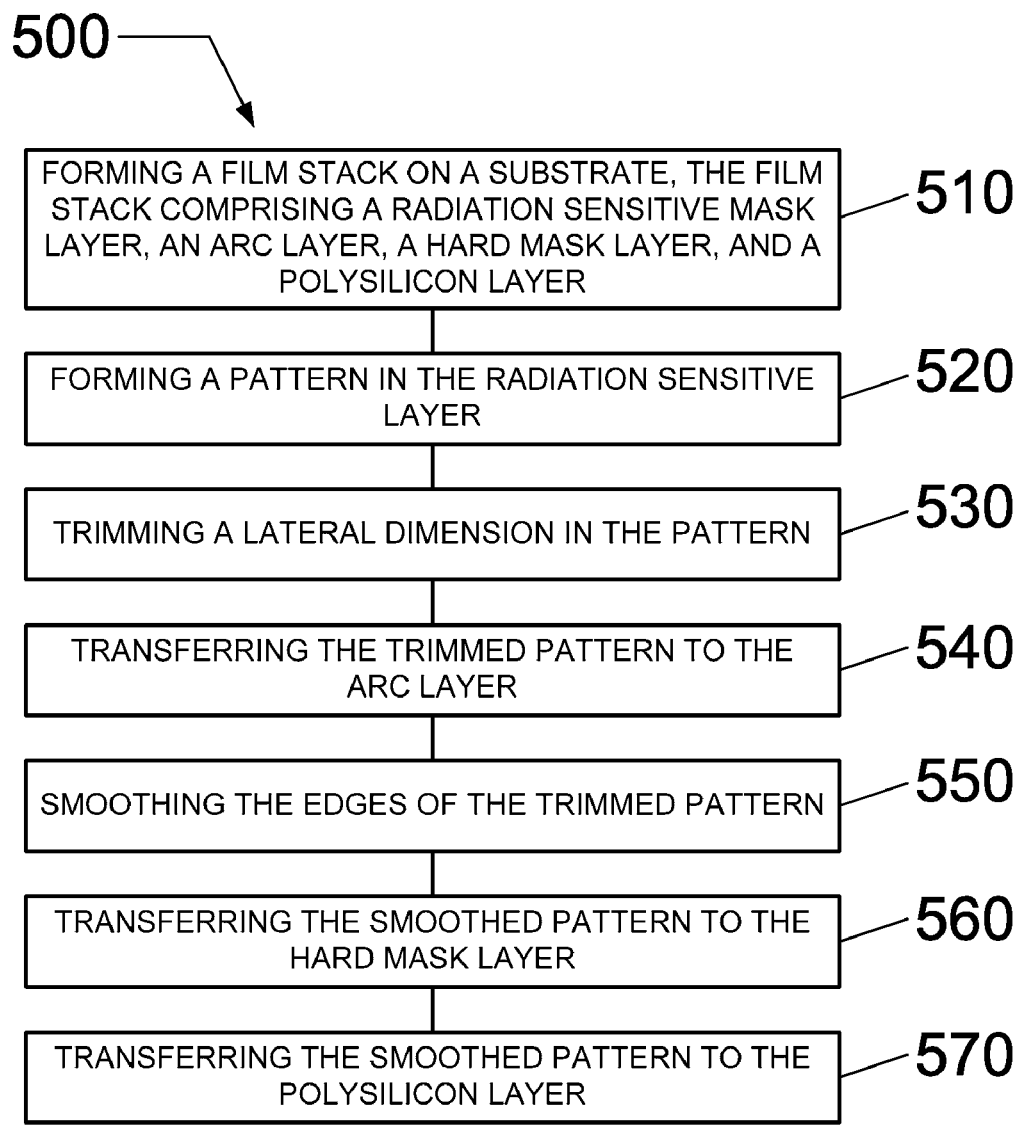
FIG. 8 presents a method of performing a pattern transfer process according to another embodiment.

Referring now to FIG. 8, a method for performing a pattern transfer process is presented. The method includes a procedure 500 beginning in 510 with forming a film stack on a substrate. The film stack may comprise a polysilicon layer, a hard mask layer formed on the polysilicon (polycrystalline silicon) layer, an anti-reflective coating (ARC) layer formed on the hard mask layer, and a radiation sensitive mask layer formed on the ARC layer. For example, the film stack may facilitate the formation of a gate stack.

In 520, a pattern is formed in the radiation sensitive mask layer using a lithographic process. The radiation sensitive mask layer may include a resist. For example, the resist may comprise 248 nm (nanometer) resists, 193 nm resists, 157 nm resists, EUV (extreme ultraviolet) resists, or electron sensitive resists. The radiation sensitive layer may be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology. The exposure to electromagnetic (EM) radiation may be performed in a dry or wet photo-lithography system, or an electron beam lithography system.

In 530, a lateral dimension of the radiation sensitive mask layer is trimmed. The trimming process may comprise an etching process, such as a dry etching process or a wet etching process. The dry etching process may include a dry plasma etching process or a dry non-plasma etching process. For example, the trimming process may include trimming the pattern by introducing a process gas including as incipient ingredients a fluorocarbon gas and an oxygen-containing gas, forming plasma from the process gas, and exposing the substrate to the plasma.

In 540, the trimmed pattern is transferred to the ARC layer. The pattern transfer process may comprise a first etching process, such as a dry etching process or a wet etching process. The dry etching process may include a dry plasma etching process or a dry non-plasma etching process. For example, the first etching process may include transferring the pattern by introducing a process gas including as incipient ingredients a fluorocarbon gas and an oxygen-containing gas, forming plasma from the process gas, and exposing the substrate to the plasma. The first etching process for transferring the trimmed pattern to the ARC layer may be performed simultaneously with trimming the pattern. Furthermore, following the transferring of the trimmed pattern to the ARC layer, an over-etch process on the ARC layer may optionally be performed.

In 550, the edges of the trimmed pattern are smoothed by exposing the trimmed pattern in the radiation sensitive mask layer to a fluorohydrocarbon-containing plasma. The fluorohydrocarbon-containing plasma may be formed by introducing a process gas including as an incipient ingredient a fluorohydrocarbon gas to a process chamber and igniting plasma from the process gas. The fluorohydrocarbon gas may be characterized by the chemical formula $C_xF_yH_z$, wherein x, y and z represent integers greater than or equal to unity. For example, the process gas may include as incipient ingredients $CHF_3$, $CH_2F_2$, $C_2HF_5$, $C_2H_2F_2$, or $C_2H_4F_2$, or any combination of two or more thereof.

Additionally, the process gas may further include as an incipient ingredient a fluorocarbon gas, or a hydrocarbon gas, or both. For example, the etching process may include using plasma formed from a process gas further comprising a fluorocarbon gas, such as those chemical compositions represented as $C_xF_y$, where x and y are integers greater than or equal to unity (e.g., $C_4F_8$, $C_5F_8$, $C_3F_6$, $C_4F_6$, $CF_4$, etc.), or a hydrocarbon gas, such as those chemical compositions represented as $C_xH_z$, where x and z are integers greater than or equal to unity (e.g., $CH_4$, $C_2H_4$, etc.), or both a fluorocarbon gas and a fluorohydrocarbon gas. Additionally, the process gas may further include as an incipient ingredient an inert gas, such as a noble gas. Furthermore, the process gas may further include as an incipient ingredient $O_2$, CO, $CO_2$, NO, $NO_2$, $N_2O$, $H_2$, $N_2$ or $NH_3$, or any combination of two or more thereof.

In 560, the smoothed pattern is transferred to the hard mask layer using a second etching process, such as a dry etching process or a wet etching process. The dry etching process may include a dry plasma etching process or a dry non-plasma etching process. For example, the second etching process may include introducing a process gas including as incipient ingredients one or more fluorocarbon gases, forming plasma from the process gas, and exposing the substrate to the plasma.

In 570, the smoothed pattern is transferred to the polysilicon layer using a third etching process, such as a dry etching process or a wet etching process. The dry etching process may include a dry plasma etching process or a dry non-plasma etching process. For example, the third etching process may comprise one or more etching steps using a halogen-containing plasma chemistry, such as a HBr-containing plasma chemistry. The one or more etch steps may include a first main etch step, a second main etch step, and an over-etch step.

The trimming process, the first etching process, the second etching process, the third etching process, the smoothing process, and the over-etch process(es) may be performed in a plasma processing system. The plasma processing system may comprise various elements, such as described in FIGS. 3 through 7, and combinations thereof.

In one embodiment, a method of performing a smoothing process comprises a process chemistry having a fluorohydrocarbon-containing gas, such as $CHF_3$, and optionally an inert gas, such as a noble gas (e.g., Ar). For example, process parameters can comprise a chamber pressure of about 1 to about 1000 mtorr (1 torr) (e.g., about 40 mtorr to about 100 mtorr), a fluorohydrocarbon-containing process gas flow rate ranging from about 1 to about 1000 sccm, an optional Ar process gas flow rate ranging from about 1 sccm to about 2000 sccm, an upper electrode (e.g., upper electrode 70 in FIG. 6) RF bias ranging from about 0 to about 2000 W, and a lower electrode (e.g., electrode 22 in FIG. 6) RF bias ranging from about 10 to about 2000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

According to an example, a method of reducing critical dimension (CD) bias and LER in a pattern transfer process is presented. The process steps and parameters are provided in Table 1.

Table 1 provides process conditions for a pattern transfer process, including a trim/ARC pattern transfer step (e.g., 530 and 540 in FIG. 8), a smooth step (e.g, 550 in FIG. 8), an ARC over-etch step, a hard mask pattern transfer step (e.g., 560 in FIG. 8), and a polysilicon pattern transfer step (e.g., 570 in FIG. 8). The polysilicon pattern transfer step includes a first polysilicon etch step, a second polysilicon etch step, and an overetch step. For each step, the pressure (P, mtorr), the RF power (coupled to the upper electrode, UEL, and the lower electrode, LEL in watts, W), and the flow rate (standard cubic centimeters per minute, sccm) for each process ingredient are provided.

12.2 nm (3σ=4.1 nm) for isolated pattern structures. Additionally, the LER remains approximately unchanged without the smooth step, while the LER reduced from about 6.78 nm to about 6.14 nm with the smooth step. Furthermore, when the pressure for the smooth step is increased from 50 mtorr to 100 mtorr, the LER is reduced further from about 6.64 nm to about 5.77 nm.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of mitigating pattern defects in a pattern transfer process, comprising:
    forming one or more layers on a substrate;
    forming a radiation sensitive mask layer on said one or more layers;
    forming a pattern in said radiation sensitive mask layer using a lithographic process;
    smoothing edges of said pattern by a single process step, said single process step includes exposing said pattern in said radiation sensitive mask layer to a fluorohydrocarbon-containing plasma, wherein said fluorohydrocarbon-containing plasma is formed using a process gas containing $CHF_3$ as an incipient ingredient; and
    transferring said smoothed pattern in said radiation sensitive mask layer to one or more of said one or more layers using one or more etching processes.

2. The method of claim 1, wherein said forming said one or more layers comprises forming an anti-reflective coating (ARC) layer.

3. The method of claim 1, wherein said forming said one or more layers comprises forming an anti-reflective coating (ARC) layer on a silicon-containing layer.

4. The method of claim 1, wherein said forming said one or more layers comprises forming an anti-reflective coating (ARC) layer on a hard mask layer overlying a silicon-containing layer.

TABLE 1

| PROCESS STEP | P (mtorr) | POWER UEL/LEL (W) | SCCM |||||||
|---|---|---|---|---|---|---|---|---|---|
| | | | HBr | $O_2$ | $CF_4$ | $C_4F_8$ | $CH_2F_2$ | He | $N_2$ | $CHF_3$ |
| TRIM/ARC PATTERN TRANSFER | 30 | 350/70 | | 40 | 100 | | | | | |
| SMOOTH | 50 | 400/50 | | | | | | | | 200 |
| ARC OVER-ETCH | 20 | 300/65 | | 2.5 | 70 | | 8 | | | |
| HARD MASK PATTERN TRANSFER | 15 | 500/160 | | | 75 | 20 | | | | |
| POLYSILICON ETCH STEP 1 | 20 | 600/100 | 550 | 4 | | | | | | |
| POLYSILICON ETCH STEP 2 | 10 | 300/30 | 250 | 4 | | | | 60 | | |
| POLYSILICON OVER-ETCH | 40 | 135/45 | 500 | 9 | | | | 440 | | |

The pattern transfer process, illustrated in Table 1, is conducted with and without the smooth step. Firstly, the CD bias (i.e., difference between the initial CD and the final CD) is reduced for both isolated pattern structures (e.g., widely spaced pattern structures) and dense pattern structures (e.g., closely spaced pattern structures). For the process conditions provided in Table 1, when the smooth step is added to the other steps, the CD bias is reduced from about 29.1 nm (3σ=4.2 nm) to about 21.4 nm (3σ=3.7 nm) for dense pattern structures, and it is reduced from 23.8 nm (3σ=5 nm) to about 5. The method of claim 1, wherein said forming said one or more layers comprises forming an anti-reflective coating (ARC) layer on an organic planarization layer (OPL) overlying a silicon-containing layer.

6. The method of claim 1, wherein said forming said radiation sensitive mask layer comprises forming a silicon-containing radiation sensitive mask layer.

7. The method of claim 1, wherein said process gas further includes as an incipient ingredient $CH_2F_2$, $C_2HF_5$, $C_2H_2F_2$, or $C_2H_4F_2$, or any combination of two or more thereof.

8. The method of claim 1, wherein said process gas further includes as an incipient ingredient a noble gas, $O_2$, CO, $CO_2$, NO, $NO_2$, $N_2O$, $H_2$, $N_2$, $NH_3$, a fluorocarbon gas, or a hydrocarbon gas, or any combination of two or more thereof.

9. The method of claim 1, wherein said exposing to said fluorohydrocarbon-containing plasma is performed at a pressure ranging from about 1 mtorr to about 1 torr.

10. The method of claim 1, wherein said exposing to said fluorohydrocarbon-containing plasma is performed at a pressure ranging from about 40 mtorr to about 100 mtorr.

11. The method of claim 1, wherein said fluorohydrocarbon-containing plasma is formed by introducing a fluorohydrocarbon gas to a process chamber and igniting plasma from said fluorohydrocarbon gas by coupling radio frequency (RF) power to a lower electrode upon which said substrate rests and coupling RF power to an upper electrode opposing said lower electrode.

12. A method of performing a pattern transfer process, comprising:
    forming a film stack on a substrate, said film stack comprising one or more layers formed on said substrate, and an anti-reflective coating (ARC) layer formed on said one or more layers, and a radiation sensitive mask layer formed on said ARC layer;
    forming a pattern in said radiation sensitive mask layer using a lithographic process;
    transferring said pattern to said ARC layer using a first etching process;
    smoothing the edges of said pattern in said radiation sensitive mask layer and said ARC layer by exposing said pattern in said radiation sensitive mask layer and said ARC layer to a fluorohydrocarbon-containing plasma;
    transferring said smoothed pattern in said radiation sensitive mask layer and said ARC layer to said hard mask layer sing a second etching process; and
    transferring said smoothed pattern in said hard mask layer to said polysilicon layer using a third etching process.

13. The method of claim 12, further comprising:
    trimming a lateral dimension of said pattern in said radiation sensitive layer, wherein said trimming and said transferring said pattern to said ARC layer are performed simultaneously.

14. The method of claim 12, further comprising:
    performing an over-etch process on said ARC layer after said transferring said pattern to said ARC layer.

15. The method of claim 13 wherein said trimming and said transferring said trimmed pattern to said ARC layer comprise introducing a process gas including as incipient ingredients a fluorocarbon gas and an oxygen-containing gas, forming plasma from said process gas, and exposing said substrate to said plasma.

16. The method of claim 12, wherein said second etching process comprises introducing a process gas including as incipient ingredients one or more fluorocarbon gases, forming plasma from said process gas, and exposing said substrate to said plasma.

17. The method of claim 12, wherein said third etching process comprise one or more etching steps using a HBr-based plasma chemistry.

18. The method of claim 12, wherein said exposing said pattern in said radiation sensitive mask layer and said ARC layer to said fluorohydrocarbon-containing plasma comprises exposing said pattern to plasma formed from a process gas including as incipient ingredients $CHF_3$, $CH_2F_2$, $C_2HF_5$, $C_2H_2F_2$, or $C_2H_4F_2$, or any combination of two or more thereof.

19. The method of claim 12, wherein said one or more layers comprises an organic planarization layer, a hard mask layer, or a silicon-containing layer, or any combination of two or more thereof.

20. The method of claim 12, further comprising:
    during said smoothing, reducing a line edge roughness in the edges of said pattern in said radiation sensitive mask layer and said ARC layer by about 15% or more relative to a reference value for said line edge roughness when said smoothing is not performed.

* * * * *